United States Patent
Chan et al.

(10) Patent No.: US 9,349,650 B2
(45) Date of Patent: May 24, 2016

(54) LOW RESISTANCE AND DEFECT FREE EPITAXIAL SEMICONDUCTOR MATERIAL FOR PROVIDING MERGED FINFETS

(71) Applicant: GLOBALFOUNDRIES INC., Grand Cayman (KY)

(72) Inventors: Kevin K. Chan, Staten Island, NY (US); Yue Ke, Fishkill, NY (US); Annie Levesque, Wappingers Falls, NY (US); Dae-Gyu Park, Poughquag, NY (US); Ravikumar Ramachandran, Pleasantville, NY (US); Amanda L. Tessier, Poughkeepsie, NY (US); Min Yang, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/524,246

(22) Filed: Oct. 27, 2014

(65) Prior Publication Data
US 2015/0380314 A1    Dec. 31, 2015

Related U.S. Application Data

(63) Continuation of application No. 14/315,844, filed on Jun. 26, 2014.

(51) Int. Cl.
*H01L 21/8234*    (2006.01)
*H01L 29/78*      (2006.01)
(Continued)

(52) U.S. Cl.
CPC .. *H01L 21/823431* (2013.01); *H01L 21/02532* (2013.01); *H01L 21/223* (2013.01); *H01L 21/2236* (2013.01); *H01L 21/26566* (2013.01);
(Continued)

(58) Field of Classification Search
CPC ............ H01L 29/66795; H01L 29/785; H01L 21/823431; H01L 27/1211; H01L 21/845; H01L 27/0886; H01L 21/823821; H01L 27/0924; H01L 29/41791; H01L 29/7853; H01L 29/0653; H01L 21/823418; H01L 27/10826
See application file for complete search history.

(56) References Cited

U.S. PATENT DOCUMENTS

| 8,168,505 B2 | 5/2012 | Yang et al. |
| 8,530,315 B2 * | 9/2013 | Cai ................... H01L 27/1211 257/E21.619 |
| 8,557,666 B2 | 10/2013 | Wei et al. |
| 8,637,384 B2 | 1/2014 | Ando et al. |

(Continued)

OTHER PUBLICATIONS

Office Action dated Oct. 7, 2015 received in parent U.S. Appl. No. 14/315,844.

*Primary Examiner* — Bac Au
(74) *Attorney, Agent, or Firm* — Scully, Scott, Murphy & Presser, P.C.

(57) ABSTRACT

A gate structure is formed straddling a first portion of a plurality of semiconductor fins that extend upwards from a topmost surface of an insulator layer. A dielectric spacer is formed on sidewalls of the gate structure and straddling a second portion of the plurality of semiconductor fins. Epitaxial semiconductor material portions that include a non-planar bottommost surface and a non-planar topmost surface are grown from at least the exposed sidewalls of each semiconductor fin not including the gate structure or the gate spacer to merge adjacent semiconductor fins. A gap is present beneath epitaxial semiconductor material portions and the topmost surface of the insulator layer. A second epitaxial semiconductor material is formed on the epitaxial semiconductor material portions and thereafter the second epitaxial semiconductor material is converted into a metal semiconductor alloy.

16 Claims, 5 Drawing Sheets

(51) Int. Cl.

| | |
|---|---|
| *H01L 21/02* | (2006.01) |
| *H01L 21/285* | (2006.01) |
| *H01L 29/66* | (2006.01) |
| *H01L 21/223* | (2006.01) |
| *H01L 21/265* | (2006.01) |
| *H01L 27/088* | (2006.01) |
| *H01L 29/08* | (2006.01) |

(52) U.S. Cl.
CPC .. *H01L 21/28518* (2013.01); *H01L 21/823418* (2013.01); *H01L 21/823437* (2013.01); *H01L 21/823468* (2013.01); *H01L 27/0886* (2013.01); *H01L 29/0847* (2013.01); *H01L 29/6681* (2013.01); *H01L 29/66795* (2013.01); *H01L 29/7848* (2013.01); *H01L 29/7853* (2013.01)

(56) References Cited

U.S. PATENT DOCUMENTS

| | | |
|---|---|---|
| 8,703,556 B2 | 4/2014 | Kelly et al. |
| 8,946,029 B2 | 2/2015 | Wong et al. |
| 2013/0105894 A1* | 5/2013 | Brodsky ............ H01L 29/66803 257/347 |
| 2014/0217517 A1 | 8/2014 | Cai et al. |
| 2014/0312420 A1 | 10/2014 | Adam et al. |
| 2015/0041855 A1 | 2/2015 | Liao et al. |
| 2015/0069527 A1 | 3/2015 | Kerber et al. |
| 2015/0137181 A1 | 5/2015 | Basker et al. |
| 2015/0170916 A1 | 6/2015 | Yu et al. |
| 2015/0228761 A1 | 8/2015 | Cheng et al. |
| 2015/0228762 A1 | 8/2015 | He et al. |
| 2015/0228780 A1 | 8/2015 | Cheng et al. |
| 2015/0270332 A1 | 9/2015 | Harley et al. |

* cited by examiner

LOW RESISTANCE AND DEFECT FREE EPITAXIAL SEMICONDUCTOR MATERIAL FOR PROVIDING MERGED FINFETS

BACKGROUND

The present application relates to semiconductor devices and methods of forming the same. More particularly, the present application relates to finFET devices including epitaxial semiconductor material portions which have a non-planar bottom surface and a non-planar top surface which merge adjacent exposed semiconductor fin portions and methods of forming the same.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties.

One setback facing CMOS transistor scaling is the ability to control transistor leakage current (Ioff), while increasing drive current (Ion). Fully depleted devices such as, for example, extremely thin semiconductor on insulator (ET-SOI), Trigate and finFET having sub-threshold voltage slope approaching theoretical values of 60 mV/dec, may be a good candidate since these devices offer excellent short channel effect (SCE) control. However, it is known that these devices greatly suffer high extension resistance which can degrade the transistor performance. Moreover, traditional ion implantation in such devices results in high resistance due to amorphization of small silicon fins in which little or no silicon seeds are available for recrystallization from activation anneal.

SUMMARY

A gate structure is formed straddling a first portion of a plurality of semiconductor fins that extend upwards from a topmost surface of an insulator layer. A dielectric spacer is formed on sidewalls of the gate structure and straddling a second portion of the plurality of semiconductor fins. Epitaxial semiconductor material portions that include a non-planar bottommost surface and a non-planar topmost surface are grown from at least the exposed sidewalls of each semiconductor fin not including the gate structure or the gate spacer to merge adjacent semiconductor fins. A gap is present beneath the epitaxial semiconductor material portions and the topmost surface of the insulator layer. A second epitaxial semiconductor material is formed on the epitaxial semiconductor material portions and thereafter the second epitaxial semiconductor material is converted into a metal semiconductor alloy.

In one aspect of the present application, a semiconductor device is provided. In one embodiment of the present application, the semiconductor device includes a plurality of semiconductor fins extending upward from a topmost surface of an insulator layer. A gate structure is straddling a first portion of each semiconductor fin of the plurality semiconductor fins and a dielectric spacer is located on a sidewall of each side of the gate structure and is straddling a second portion of each semiconductor fin of the plurality of semiconductor fins. Epitaxial semiconductor material portions having a non-planar bottommost surface and a non-planar topmost surface are located between and merge exposed semiconductor fin portions of an adjacent pair of semiconductor fins of the plurality of semiconductor fins. A metal semiconductor alloy is located on the non-planar bottommost surface and the non-planar topmost surface of each epitaxial semiconductor material portion, wherein a gap is present beneath the epitaxial semiconductor material portions and the topmost surface of the insulator layer.

In another embodiment of the present application, a method of forming a semiconductor device is provided. In one embodiment of the present application, the method includes providing a plurality of semiconductor fins extending upward from a topmost surface of an insulator layer. A gate structure is then formed straddling a first portion of each semiconductor fin of the plurality of semiconductor fins. Next, a dielectric spacer is formed on a sidewall of each side of the gate structure and straddling a second portion of each semiconductor fin of the plurality semiconductor fins. An adjacent pair of semiconductor fins of the plurality of semiconductor fins is merged by forming epitaxial semiconductor material portions comprising a first epitaxial semiconductor material and having a non-planar bottommost surface and a non-planar topmost surface on at least sidewalls of each exposed semiconductor fin portion. A second epitaxial semiconductor material comprising a different semiconductor material that the first epitaxial semiconductor material is formed on the bottommost surface and the topmost surface of each epitaxial semiconductor material portion. Next, the second epitaxial semiconductor material is converted into a metal semiconductor alloy.

DETAILED DESCRIPTION

Figure 1:
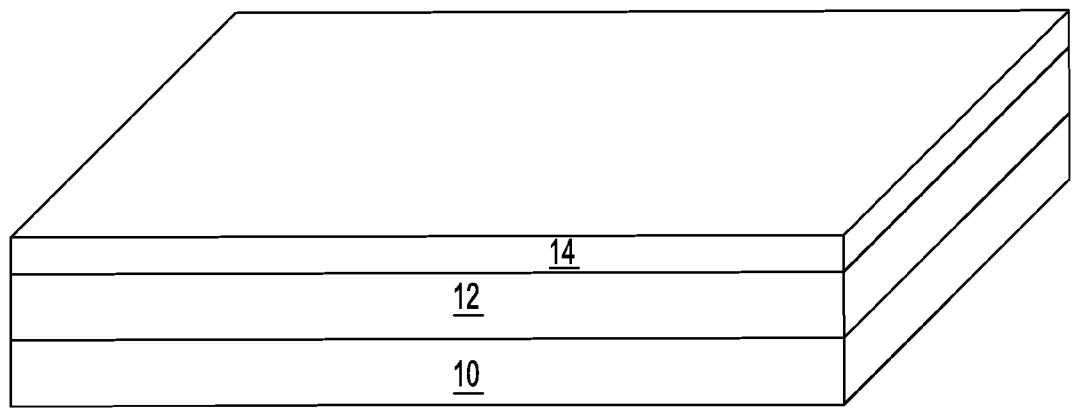
FIG. 1 is a perspective view depicting a first exemplary semiconductor structure including, from bottom to top, a handle substrate, an insulator layer and a topmost semiconductor layer that can be employed in one embodiment of the present application.

The present application will now be described in greater detail by referring to the following discussion and drawings that accompany the present disclosure. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

The present application relates to finFET devices (i.e., 3D non-planar transistors) including epitaxial semiconductor material portions that merge adjacent finFETs, have a low resistance and are defect free. In some embodiments of the present application, the term "low resistance" denotes a resistance of 450 ohm/square or less. In some embodiments of the present application, the term "defect free" denotes a defect density of 1E8 atoms/cm$^2$ or less.

Referring to FIG. 1, there is illustrated a first exemplary semiconductor structure including a semiconductor on insulator (SOI) substrate that can be employed in one embodiment of the present application. The SOI substrate that can be employed may include a handle substrate 10, an insulator layer 12 located on a topmost surface of the handle substrate 10, and a topmost semiconductor layer 14 located on a topmost surface of the insulator layer 12. The handle substrate 10 provides mechanical support for the insulator layer 12 and the topmost semiconductor layer 14.

The handle substrate 10 and the topmost semiconductor layer 14 of the SOI substrate shown in FIG. 1 may comprise a semiconductor material. In one embodiment, the handle substrate 10 and the topmost semiconductor layer 14 of the SOI substrate may comprise a same semiconductor material. In another embodiment, the handle substrate 10 and the topmost semiconductor layer 14 of the SOI substrate may comprise different semiconductor materials. The term "semiconductor material" as used herein in connection with the semiconductor material of the handle substrate 10 and the topmost semiconductor layer 14 denotes any material that has semiconducting properties. Illustrative examples of semiconductor materials that can be used for the handle substrate 10 and the topmost semiconductor layer 14 include, for example, Si, Ge, SiGe, SiC, SiGeC, and III/V compound semiconductors such as, for example, InAs, GaAs, InGaAs or InP. Multilayers of these semiconductor materials can also be used as the semiconductor material of the handle substrate 10 and the topmost semiconductor layer 14. In one embodiment, the handle substrate 10 and the topmost semiconductor layer 14 are both comprised of silicon.

In some embodiments, the handle substrate 10 is a non-semiconductor material including, for example, a dielectric material (different from insulator layer 12) and/or a conductive material. In yet other embodiments, the handle substrate 10 can be omitted and a substrate including only the insulator layer 12 and the topmost semiconductor layer 14 can be used in the present application.

In some embodiments, the handle substrate 12 and the topmost semiconductor layer 14 may have the same or different crystal orientation. For example, the crystal orientation of the handle substrate and/or the topmost semiconductor layer may be {100}, {110}, or {111}. Other crystallographic orientations besides those specifically mentioned can also be used in the present application. The handle substrate 10 and/or the topmost semiconductor layer 14 may be a single crystalline semiconductor material, a polycrystalline material, or an amorphous material. Typically, at least the topmost semiconductor layer 14 is a single crystalline semiconductor material. In some embodiments, the topmost semiconductor layer 14 that is located on the topmost surface of the insulator layer 12 can be processed to include semiconductor regions having different crystal orientations.

The insulator layer 12 of the first exemplary semiconductor structure shown in FIG. 1 may be a crystalline, or non-crystalline, oxide or nitride. In one embodiment, the insulator layer 12 is an oxide such as, for example, silicon oxide. The insulator layer 12 may be a single continuous layer that spans the entity of the handle substrate 10 or it may be discontinuous. When a discontinuous insulator region is present, the insulator region exists as an isolated island that is surrounded by semiconductor material.

The first exemplary semiconductor substrate (i.e., the SOI substrate) shown in FIG. 1 may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of one of semiconductor layers of the two semiconductor wafers to a layer having a thickness that is more desirable for use as the topmost semiconductor layer 14.

In one example, the thickness of the topmost semiconductor layer 14 of the SOI substrate can be from 10 nm to 100 nm. In another example, the thickness of the topmost semiconductor layer 14 of the SOI substrate can be from 50 nm to 70 nm. In some embodiments, and when an ETSOI (extremely thin semiconductor-on-insulator) substrate is employed, the topmost semiconductor layer 14 of the SOI has a thickness of less than 10 nm. If the thickness of the topmost semiconductor layer 14 is not within one of the above mentioned ranges, a thinning step such as, for example, planarization or etching can be used to reduce the thickness of the topmost semiconductor layer 14 to a value within one of the ranges mentioned above. The insulator layer 12 of the SOI substrate typically has a thickness from 1 nm to 200 nm, with a thickness from 100 nm to 150 nm being more typical. The thickness of the handle substrate 10 of the SOI substrate is inconsequential to the present application.

Figure 2:
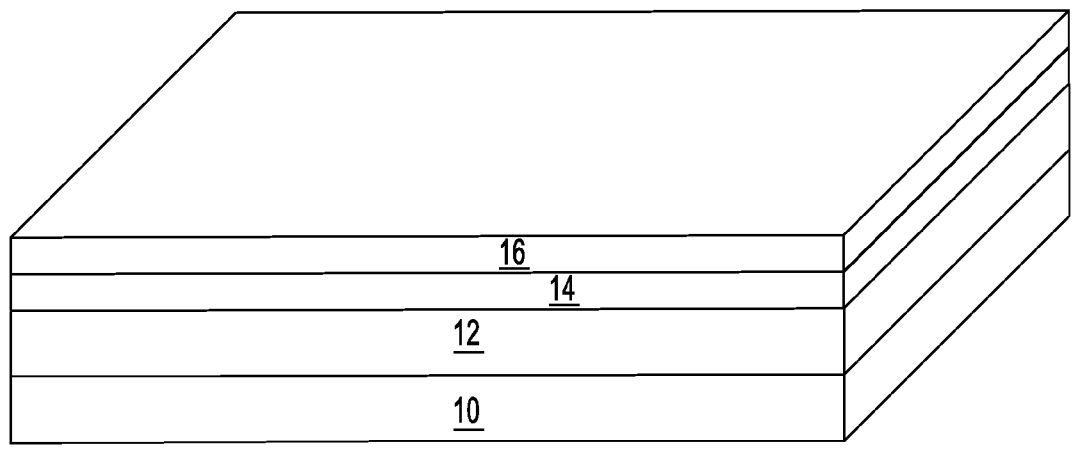
FIG. 2 is a perspective view depicting the first exemplary semiconductor structure of FIG. 1 after forming a blanket layer of hard mask material on an exposed surface of the topmost semiconductor layer in accordance with one embodiment of the present application.

Referring now to FIG. 2, there is illustrated the first exemplary semiconductor structure of FIG. 1 after forming a blanket layer of hard mask material 16 on an exposed surface of the topmost semiconductor layer 14. In some embodiments, the blanket layer of hard mask material 16 can be omitted. When present, the blanket layer of hard mask material 16 will subsequently provide a fin cap atop a semiconductor fin that prevents direct contact of the gate dielectric material portion with an uppermost surface of the semiconductor fin (in such an embodiment, the gate dielectric material portion only comes into direct contact with the two sidewall surfaces of each semiconductor fin). When no blanket layer of hard mask material 16 is employed, a fin cap is absent from the uppermost surface of the semiconductor fin and, as such, the gate dielectric material portion can directly contact the uppermost surface of the semiconductor fin as well as the two sidewall surfaces of each semiconductor fin.

The blanket layer of hard mask material 16, which will be used hereinafter as a fin cap, can be composed of a dielectric hard mask material such as, for example, an oxide, nitride, boron nitride and/or oxynitride. In one embodiment, the blanket layer of hard mask material 16 can be composed of silicon oxide, silicon nitride, boron nitride and/or silicon oxynitride. In one embodiment, the blanket layer of hard mask material 16 can be formed utilizing a thermal process such as, for example, a thermal oxidation or a thermal nitridation process. In another embodiment, the blanket layer of hard mask material 16 can be formed by a deposition process such as, for example, chemical vapor deposition (CVD), and plasma enhanced chemical vapor deposition (PECVD). The thickness of the blanket layer of hard mask material 16 can be from 5 nm to 50 nm, although lesser and greater thicknesses can also be employed.

Figure 3:
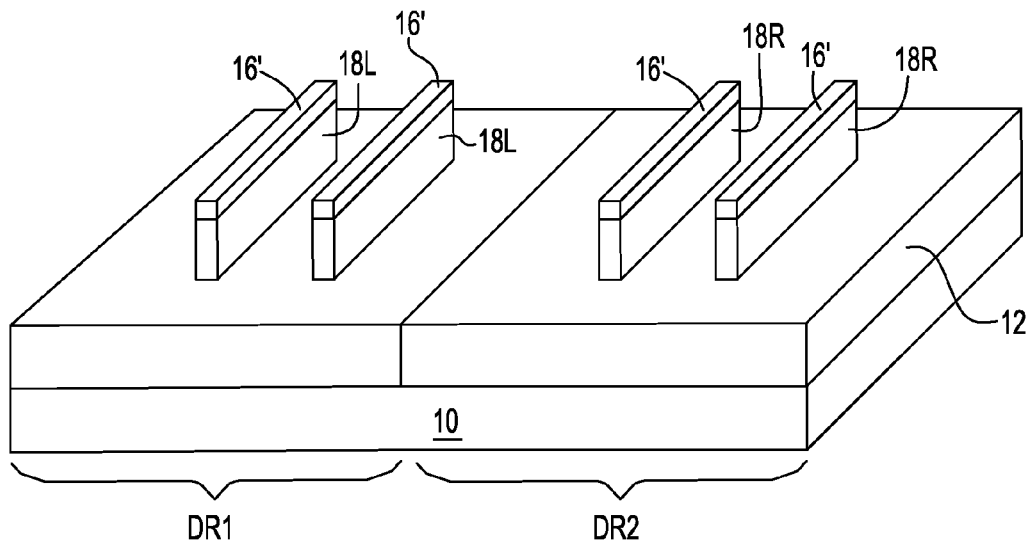
FIG. 3 is a perspective view depicting the first exemplary semiconductor structure of FIG. 2 after forming a plurality of a first set of semiconductor fins and a plurality of a second set of semiconductor fins, each set of fins extending upward from a topmost surface of the insulator layer in accordance with an embodiment of the present application.

Referring now to FIG. 3, there is illustrated the initial structure shown in FIG. 2 after forming a plurality of a first set of semiconductor fins 18L and a plurality of a second set of semiconductor fins 18R. Each set of semiconductor fins 18L, 18R extends upward from a topmost surface of the insulator layer 12. Also, each set of semiconductor fins 18L, 18R includes a fin cap 16' located on an uppermost surface of the semiconductor fin. The fin cap 16' comprises a remaining portion of the blanket layer of hard mask material 16. In some embodiments, the fin cap 16' can be omitted from atop each semiconductor fin 18L, 18R.

Within the drawing, the plurality of the first set of the semiconductor fins 18L is formed in a first device region DR1, while the plurality of a second set of semiconductor fins 18R is formed within a second device region DR2. In some embodiments, a single device region (either DR1 or DR2) is present. Notwithstanding which embodiment is employed, at least two semiconductor fins must be formed in each device region.

Each semiconductor fin 18L, 18R that is provided comprises a remaining portion of the topmost semiconductor layer 14. In one embodiment, each semiconductor fin 18L, 18R may comprise single crystalline silicon. As shown in FIG. 3, the bottommost surface of each plurality of semiconductor fins 18L, 18R forms a material interface within the topmost surface of the insulator layer 12. As is also shown, each semiconductor fin within the plurality of the first set of semiconductor fins 18L and the plurality of the second set of semiconductor fins 18R lie parallel to each other.

The structure shown in FIG. 3 can be formed by lithography and etching. The lithographic step can include forming a photoresist (not shown) atop the blanket layer of hard mask material 16, exposing the photoresist to a desired pattern of radiation and then developing the exposed photoresist utilizing a conventional resist developer. The pattern within the photoresist is then transferred through the blanket layer of hard mask material 16 and into the topmost semiconductor layer 14. A single etch or multiple etching can be used to provide the structure illustrated in FIG. 3. When no hard mask material 16 is present, the first exemplary semiconductor structure shown in FIG. 1 can be patterned as described above. The single etch, or multiple etches, can include a dry etch process, a chemical wet etch process, or any combination thereof. When a dry etch is used, the dry etch can be a reactive ion etch process, a plasma etch process, ion beam etching or laser ablation. The patterned photoresist material can be removed after transferring the pattern into at least the blanket layer of hard mask material 16 utilizing a conventional stripping process.

In another embodiment of the present application, each semiconductor fin 18L, 18R can be formed utilizing a SIT (sidewall image transfer) process. In a typical SIT process, spacers are formed on sidewall surface of a sacrificial mandrel that is formed on the topmost semiconductor layer 14. The sacrificial mandrel is removed and the remaining spacers are used as a hard mask to etch the topmost semiconductor layer 14. The spacers are then removed after the semiconductor fins 18L, 18R have been formed.

Each semiconductor fin within the plurality of the first set of semiconductor fins 18L and the plurality of the second set of semiconductor fins 18R can have a height, as measured from a topmost surface of the insulator layer 12 to a topmost surface of the semiconductor fin, of from 5 nm to 50 nm and a width, as measured from one sidewall surface to an opposing sidewall surface, of from 20 nm to 5 nm. In another example, each semiconductor fin within the plurality of the first set of semiconductor fins 18L and the plurality of the second set of semiconductor fins 18R has a height, as measured from a topmost surface of the insulator layer 12 to the topmost surface of the semiconductor fin, of from 10 nm to 25 nm and a width, as measured from one sidewall surface to an opposing sidewall surface, of from 15 nm to 7 nm.

Figure 4:
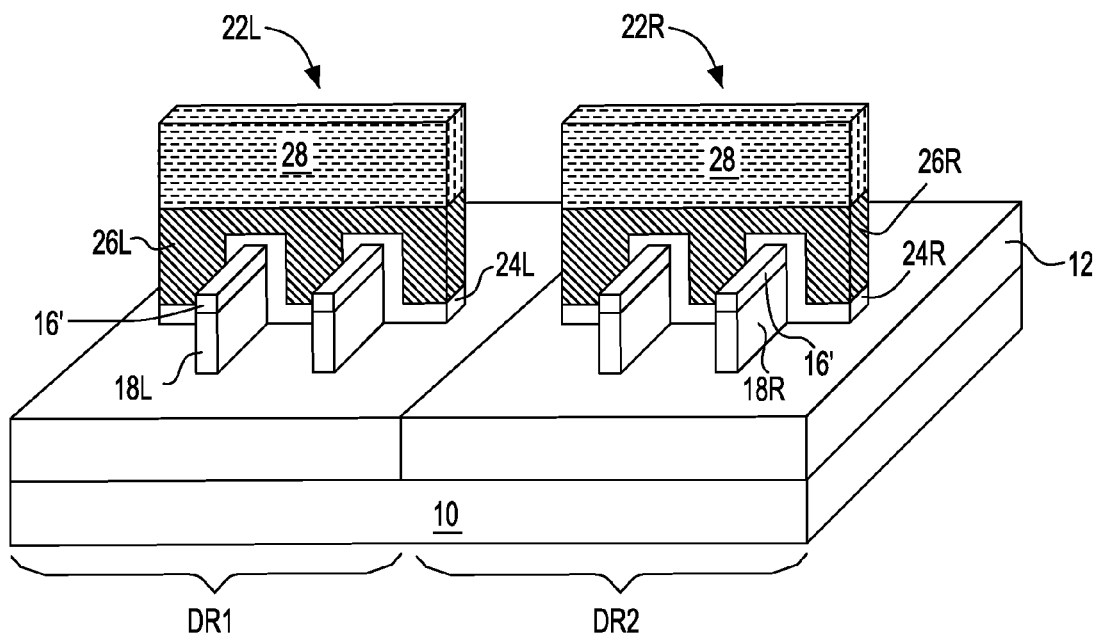
FIG. 4 is perspective view depicting the first exemplary semiconductor structure of FIG. 3 after forming a first gate structure that straddles a first portion of each semiconductor fin within the first set of semiconductor fins, and a second gate structure that straddles a first portion of each semiconductor fin within the second set of semiconductor fins in accordance with an embodiment of the present application.

Referring now to FIG. 4, there is illustrated the structure of FIG. 3 after forming a first gate structure 22L that straddles a first portion of each semiconductor fin 18L of the first set of semiconductor fins, and a second gate structure 22R that straddles a first portion of each semiconductor fin 18R of the second set of semiconductor fins in accordance with an embodiment of the present application. As is shown, some bottommost surface portions of the first gate structure 22L are present along sidewalls and atop each semiconductor fin 18L of the first set of semiconductor fins, while other bottommost surface portions of the first gate structure 22L are in direct physical contact with a topmost surface of insulator layer 12 in the first device region DR1. As is also shown, some bottommost surface portions of the second gate structure 22R are present along sidewalls and atop each semiconductor fin 18R of the second set of semiconductor fins, while other bottommost surface portions of the second gate structure 22R are in direct physical contact with a topmost surface of insulator layer 12 in the second device region DR2.

In some embodiments (and as shown in the drawings), the first gate structure 22L, 22R is a functional gate structure. By "functional gate structure" it is meant, a structure used to control output current (i.e., flow of carriers in a channel) of a semiconductor device through an electrical field or, in some instances, a magnetic field. In such an embodiment, each gate structure 22L, 22R includes a gate dielectric material portion 24L, 24R, and a gate conductor material portion 26L, 26R. An optional gate cap 28 can be located on each of the gate conductor material portions 26L, 26R. It is noted that each gate structure 22L, 22R lies perpendicular to each semiconductor fin 18L, 18R.

In other embodiments (not shown in the drawings), the first gate structure 22L, 22R can be a sacrificial gate structure which is formed at this point of the present application utilizing replacement gate technology. The sacrificial gate structure may be composed of a semiconductor material or other sacrificial material. Later in the process sequence of the present application, typically after merging exposed portions of the semiconductor fins and forming a metal semiconductor alloy on the semiconductor material used to merge the semiconductor fins, the sacrificial gate structure is removed and replaced with a functional gate structure having a gate dielectric material portion and a gate conductor material portion as described above.

In one embodiment, the first and second gate structures 22L, 22R can be formed by forming a gate material stack of, from bottom to top, a blanket layer of gate dielectric material, a blanket layer of a gate conductor material, and optionally, a blanket layer of a gate cap material.

The blanket layer of gate dielectric material that is can be used may include a semiconductor oxide, semiconductor nitride, semiconductor oxynitride, or a high k material having a dielectric constant greater than silicon oxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon oxide, and a high k gate dielectric can be formed.

The blanket layer of gate dielectric material can be formed by any deposition technique including, for example, chemical vapor deposition (CVD), plasma enhanced chemical vapor deposition (PECVD), physical vapor deposition (PVD), and sputtering, atomic layer deposition. In some embodiments, a thermal growth technique can be used in forming the blanket layer of gate dielectric material. In one embodiment of the present application, the blanket layer of gate dielectric material can have a thickness in a range from 1 nm to 10 nm. Other thicknesses that are lesser than or greater than the aforementioned thickness range can also be employed for the blanket layer of gate dielectric material.

After providing the blanket layer of gate dielectric material, a blanket layer of gate conductor material can be formed atop the blanket layer of gate dielectric material. The blanket layer of gate conductor material can include any conductive material including, for example, a doped semiconductor-containing material, (i.e., doped polysilicon or doped SiGe), an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. The blanket layer of gate conductor material can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes. When a metal silicide is formed, a conventional silicidation process is employed. In one embodiment, the blanket layer of gate conductor material has a thickness from 1 nm to 100 nm. Other thicknesses that are lesser than or greater than the aforementioned thickness range can also be employed for the blanket layer of gate conductor material.

A blanket layer of gate cap material can be formed atop the blanket layer of gate conductor material. In some embodiments, the blanket layer of gate cap material is optional. When present, the blanket layer of gate cap material comprises a same or different material as employed for the blanket layer of hard mask material 16. In one embodiment, the blanket layer of gate cap material comprises a different material than as employed for the blanket layer of hard mask material 16. For example, the blanket layer of gate cap material can be composed of silicon nitride, silicon oxide or boron nitride, while the blanket layer of hard mask material 16 can be composed of silicon oxide. The blanket layer of gate cap material can be formed utilizing one of the techniques mentioned above in forming the blanket layer of hard mask material 16. In one embodiment, the blanket layer of gate cap material has a thickness from 5 nm to 100 nm. Other thicknesses that are lesser than or greater than the aforementioned thickness range can also be employed for the blanket layer of gate cap material.

The gate material stack including the blanket layers of gate dielectric material, gate conductor material, and optional gate cap material is then patterned by lithography and etching. The lithographic step can include forming a photoresist (not shown) atop the blanket layer of gate cap material (or the blanket layer of gate conductor, if no gate cap material is present), exposing the photoresist to a desired pattern of radiation and then developing the exposed photoresist utilizing a conventional resist developer. The pattern within the photoresist is then transferred through the blanket layer of gate cap material and into underlying blanket layers of gate conductor material and gate dielectric material. A single etch or multiple etching can be used to provide the structure illustrated in FIG. 4. The etch or multiple etch can include a dry etch process, a chemical wet etch process, or any combination thereof. When a dry etch is used, the dry etch can be a reactive ion etch process, a plasma etch process, ion beam etching or laser ablation. In one embodiment, the patterned photoresist material can be removed after transferring the pattern into at least the blanket layer of gate material utilizing a conventional stripping process.

After patterning the gate material stack, the remaining portions of the blanket layer of gate dielectric material provide gate dielectric material portions 24L, 24R, the remaining portions of the blanket layer of gate conductor material provide gate conductor material portions 26L, 26R and, if present, the remaining portion of the gate cap material provides gate cap 28.

In another embodiment, a block mask can be formed in one of the device regions, the first or second gate structure is formed in the another of the device regions not including the block mask, the block mask is removed, another block mask is formed in the device region including the first or second gate structure, the other of the first and second gate structure not previously formed is formed into the another device region, and the another block mask can be removed. This particular embodiment permits the formation of a first gate structure 22L that can have at least one different material portion, i.e., gate dielectric material portion and/or gate conductor portion, that differs from the gate dielectric material portion and/or gate conductor portion of the second gate structure 22R.

As previously stated, the first gate structure 22L that is provided straddles a first portion of each semiconductor fin of the plurality of the first set of semiconductor fins 18L, while leaving other portions of each semiconductor fin of the plurality of the first set of semiconductor fins 18L exposed. Likewise, and as also previously stated, the second gate structure 22R that is provided straddles a first portion of each semiconductor fin of the plurality of the second set of semiconductor fins 18R, while leaving other portions of each semiconductor fin of the plurality of the second set of semiconductor fins 18R exposed. Within the drawing of the present application, the exposed portions of each semiconductor fin 18L located in front of the first gate structure 22L are visible, while the exposed portions of each semiconductor fin 18L located behind the first gate structure 22L are not visible. Likewise, the exposed portions of each semiconductor fin 18R located in front of the second gate structure 22R are visible, while the exposed portions of each semiconductor fin 18R located behind the second gate structure 22R are not visible. The exposed portions of each semiconductor fin 18L, 18R are locations in which a source region and a drain region will be subsequently formed.

Figure 5:
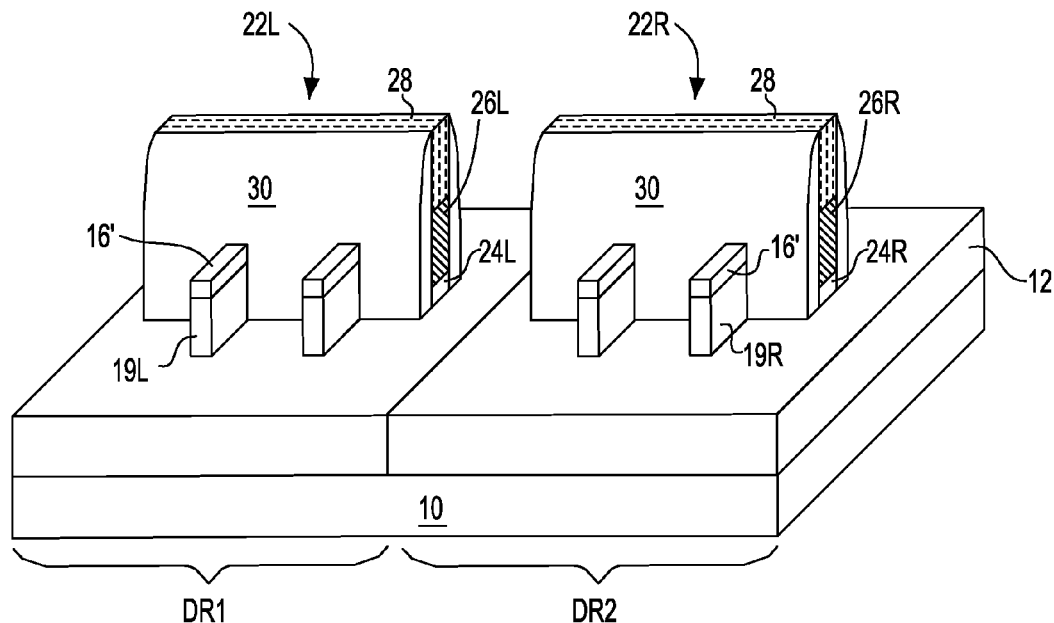
FIG. 5 is perspective view depicting the first exemplary semiconductor structure of FIG. 4 after forming a dielectric spacer on sidewalls of each gate structure and straddling a second portion of each semiconductor fin within the first and second sets of semiconductor fins in accordance with an embodiment of the present application.

Referring now to FIG. 5, there is illustrated the first exemplary semiconductor structure of FIG. 4 after forming a dielectric spacer 30 on sidewalls of each gate structure 22L, 22R in accordance with an embodiment of the present application. As is shown, each dielectric spacer 30 straddles a second portion of each semiconductor fin 18L, 18R, has a sidewall surface that is in direct physical contact with a sidewall of the gate structures 22L, 22R and has a base that is located on the topmost surface of the insulator layer 12. Each dielectric spacer 30 covers the entire sidewall of each gate structure 22L, 22R and has a topmost surface that is coplanar with a topmost surface of each gate structure 22L, 22R.

Each dielectric spacer 30 can be provided by depositing a layer of a spacer dielectric material (such as, for example, one of the materials mentioned above for the blanket layer of hard mask material 16) and then performing an anisotropic etch. As shown, each dielectric spacer 30 has a width at the base that is greater than a width at the tip of the dielectric spacer 30. In one embodiment, each dielectric spacer 30 comprises a spacer dielectric material that differs from at least the dielectric material that provides the gate cap 28 and/or fin cap 16'.

In some embodiments, the exposed portions of each of the semiconductor fins 18L, 18R which are not covered by gate structure 22L, 22R and gate spacer 30, can be doped at this point of the present application to form a source region within exposed portions of each semiconductor fin 18L, 18R and one side of each gate structure 22L, 22R, while forming a drain region within the other exposed portions of each semiconductor fin and on the other side of each gate structure 22L, 22R. The doping of the exposed portions of each semiconductor fin 18L, 18R can be performed by gas phase doping, plasma doping, or a gas cluster ion beam process. As will be understood by those skilled in the art, the exposed portions of each semiconductor fin on one side of the gate structure will serve as the source region of the semiconductor device, while the exposed portions of each semiconductor fin on the other side of the gate structure will serve as the drain region of the semiconductor device. By way of illustration, reference numerals 19L, 19R denote doped semiconductor portions of each semiconductor fin 18L, 18R that are visible in the drawings; these doped semiconductor regions 19L, 19R of each semiconductor fin 18L, 18R can represent, for example, the source region. The doped semiconductor portions of each semiconductor fin (not labeled and not visible in the drawings) that are located behind the first gate structure 22L, and the second gate structure 22R can represent, for example, the drain region.

Figure 6A:
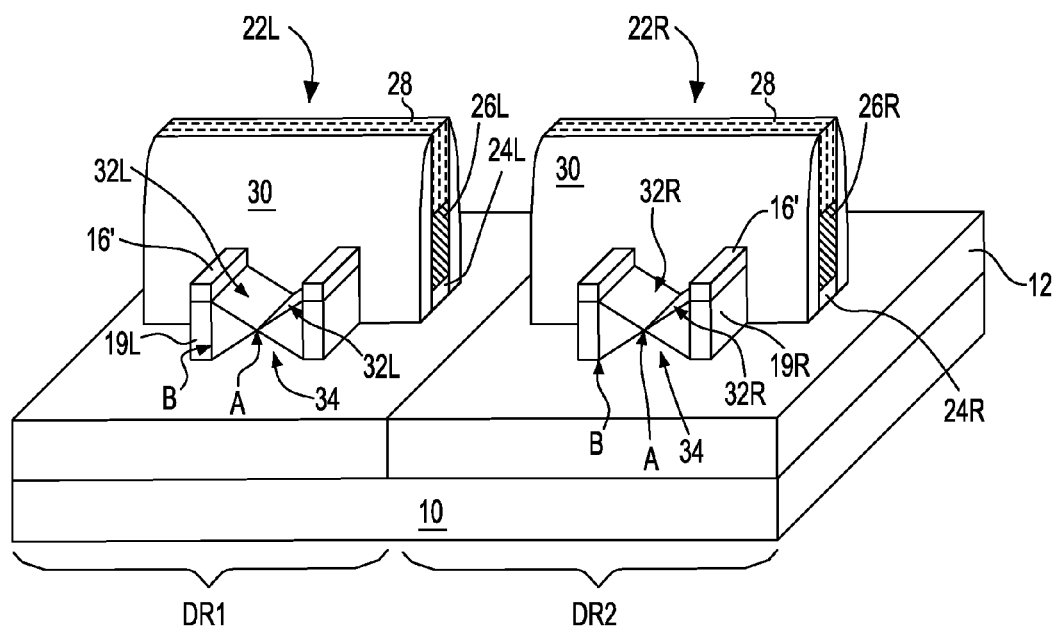
FIG. 6A is perspective view depicting the first exemplary semiconductor structure of FIG. 5 after forming epitaxial semiconductor material portions that merge adjacent semiconductor fins of the first set of semiconductor fins and other epitaxial semiconductor material portions that merge adjacent semiconductor fins of the second set of semiconductor fins in accordance with an embodiment of the present application.

Referring now to FIG. 6A, there is illustrated the structure of FIG. 5 after merging adjacent and exposed semiconductor fin portions (i.e., semiconductor fin portions not covered by the gate dielectric 30 and gate structure 22L) of the first set of semiconductor fins 18L and adjacent and exposed semiconductor fin portions of each semiconductor fin of the second set of semiconductor fins 18R in accordance with an embodiment of the present application. In some embodiments, the exposed semiconductor fin portions that are being merged can be doped semiconductor fin regions 19L and doped semiconductor fin regions 19R. In other embodiments, the exposed semiconductor fin portions that are being merged can be non doped semiconductor fin regions and non doped semiconductor fin regions.

In the drawing, reference numeral 32L denotes an epitaxial semiconductor material portion that is formed and used to merge the exposed semiconductor fin portions of each first set of semiconductor fins 18L, while reference numeral 32R denotes another epitaxial semiconductor material portion that is formed and used to merge the exposed semiconductor fin portions of each second set of semiconductor fins 18R. As is shown, each epitaxial semiconductor material portion 32L, 32R extends from a sidewall surface of each exposed semiconductor fin portion.

Although not shown in FIG. 6A, an epitaxial semiconductor material portion is also formed extending from the sidewalls on the outside surfaces of the outermost fins in each of the first and second sets of semiconductor fins. It is noted that the epitaxial semiconductor material portions 32L, 32R located on one side of the gate structure 22L, 22R can serve as the source contact region of the fin structure within the specific device region, while the epitaxial semiconductor material portions located on the other side of the gate structure 22L, 22R can serve as the drain contact region of the fin structure with the specific device region. In the drawings, and by way of example, the epitaxial semiconductor material portions 32L, 32R, shown in each of the device regions represents a source contact region of the fin structure, while the drain contact region (not shown) is located on the other side of the gate structure in each of the device regions.

The semiconductor material that is used in forming the epitaxial semiconductor material portions 32L, 32R is formed by a selective epitaxial growth process on the exposed semiconductor fin portions (i.e., sidewall surfaces) of each semiconductor fin. As such, each first semiconductor material portion 32L, 32R has an epitaxial relationship with the sidewall surface of each exposed semiconductor fin portion. In some embodiments (not shown), the gate cap 28 can be removed from the gate conductor material portion 26L, 26R prior to selective epitaxial growth utilizing a conventional stripping process. In such an embodiment, a semiconductor material layer can be formed on the exposed surface of the gate conductor material portion 26L, 26R.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon oxide or silicon nitride surfaces.

Examples of various epitaxial growth process apparatuses that are suitable for use in forming the epitaxial semiconductor material portions 32L, 32R of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the semiconductor material that provides the epitaxial semiconductor material portions 32R, 32R typically ranges from 200° C. to 900° C. Although higher temperature typically results in faster deposition, the faster deposition may result in crystal defects and film cracking.

In the present application, each epitaxial semiconductor material portion 32L, 32R is formed by epitaxial utilizing a low pressure. By "low pressure" it is meant a pressure ranging from 1 mtorr to 750 torr. The low pressure epitaxial growth process provides epitaxial semiconductor material portions that have a non-planar bottommost surface and a non planar uppermost surface and are defect free. Also, the low pressure epitaxial growth process does not completely fill in the space that is located between adjacent exposed semiconductor fin portions of each semiconductor fin. Instead, the low pressure growth process ensures that a gap 34 is present beneath the epitaxial semiconductor material portions 32L, 32R that merged adjacent exposed semiconductor fin portions of each semiconductor fin.

Figure 6B:
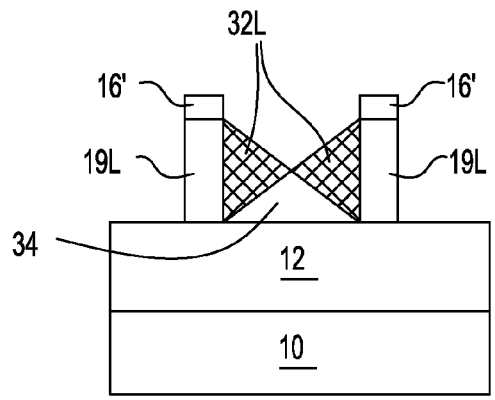
FIG. 6B is a cross sectional view illustrating the merged adjacent semiconductor fins of the first set of semiconductor fins shown in FIG. 6A.
Figure 6C:
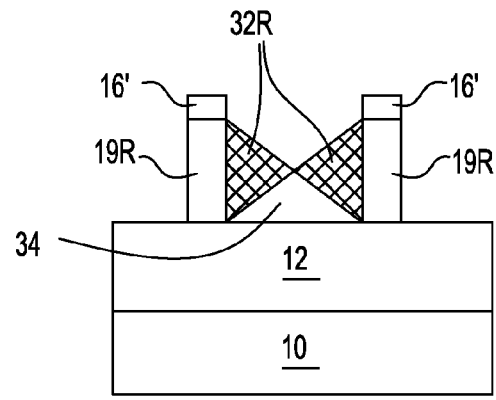
FIG. 6C is a cross sectional view illustrating the merged adjacent semiconductor fins of the second set of semiconductor fins shown in FIG. 6A.

When a fin cap 16' is present, the low pressure epitaxial growth process forms a triangular shaped (as shown in FIGS. 6A, 6B, and 6C) epitaxial semiconductor material portions 32L, 32R that extends from the sidewalls of the exposed semiconductor fin portions of each semiconductor fin. As shown, each triangular shaped epitaxial semiconductor material portion 32L, 32R has three corners and three sidewalls. One of the sidewalls of each triangular shaped epitaxial semiconductor material portion 32L, 32R is referred to as the base, B. The base, B, of each triangular shaped epitaxial semiconductor material portion 32L, 32R is in direct physical contact with a sidewall surface of the exposed semiconductor fin portion. The other two slanted sidewalls of each triangular shaped epitaxial semiconductor material portion 32L, 32R converge at tip A. Merging of adjacent exposed semiconductor fin portions occurs at the union between two tip portions of adjacent triangular shaped epitaxial semiconductor material portions 32L, 32R. As shown, a gap 34 is present beneath the epitaxial semiconductor material portions 32L, 32R that merged the two adjacent exposed semiconductor fin portions.

Figure 9A:
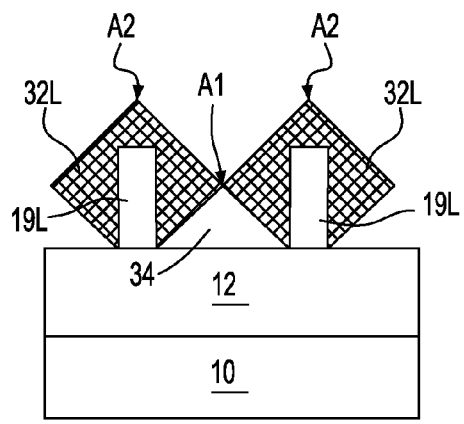
FIG. 9A is a cross sectional view illustrating merged adjacent semiconductor fins of the first set of semiconductor fins in an embodiment in which no fin cap is present.
Figure 9B:
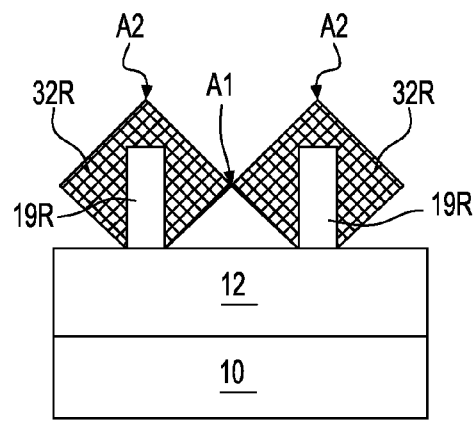
FIG. 9B is a cross sectional view illustrating merged adjacent semiconductor fins of the second set of semiconductor fins in an embodiment when no fin cap is present.

When no fin cap 16' is present, the low pressure epitaxial growth process forms diamond shaped (as shown in FIGS. 9A and 9B) epitaxial semiconductor material portions 32L, 32R that extend from the sidewalls and a topmost surface of the exposed semiconductor fin portions of each semiconductor fin. As shown, each diamond shaped epitaxial semiconductor material portion 32L, 32R has four slanted sidewalls. Two of the slanted sidewalls of each diamond shaped epitaxial semiconductor material portion 32L, 32R converge at tip A1. Another tip A2 of each diamond shaped epitaxial semiconductor material portion 32L, 32R that is formed by union of other two sidewalls is located directly above the topmost surface of each semiconductor fin. Merging of adjacent exposed semiconductor fin portions occurs at the union between two tip portions A1 of adjacent diamond shaped epitaxial semiconductor material portions 32L, 32R. As shown, a gap 34 is present beneath the epitaxial semiconductor material portions 32L, 32R that merged the two adjacent exposed semiconductor fin portions.

A number of different sources may be used for the deposition of the epitaxial semiconductor material portions 32L, 32R. In some embodiments, the gas source for the deposition of the epitaxial semiconductor material portions 32L, 32R include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments, the epitaxial growth of the epitaxial semiconductor material portions 32L, 32R can include a dopant gas used in conjunction with the source gas; such a process may be referred to herein as an in-situ doping epitaxial growth process. The dopant gas that can be present in the epitaxial growth process provides a conductivity type, either n-type or p-type, to the epitaxial semiconductor material portions 32L, 32R. When an epitaxial semiconductor material portions 32L, 32R of an n-type conductivity is to be formed, the dopant gas includes at least one n-type dopant, e.g., phosphorus or arsenic. For example, when phosphorus is the n-type dopant, the dopant gas can be phosphine ($PH_3$), and when arsenic is the n-type dopant, the dopant gas can be arsine ($AsH_3$). In one example, when the conductivity type dopant is n-type, the dopant gas include phosphine gas ($PH_3$) present in a ratio to silane ($SiH_4$) ranging from 0.00001% to 2%. In another example, when the conductivity type dopant is n-type, the dopant gas include phosphine gas ($PH_3$) present in a ratio to silane ($SiH_4$) ranging from 0.0001% to 0.1%.

When epitaxial semiconductor material portions 32L, 32R of a p-type conductivity are to be formed, a dopant gas including at least one p-type dopant, e.g., B, is employed as the semiconductor material 32. For example, when boron is the p-type dopant, the dopant gas can be diborane ($B_2H_6$). In one embodiment, wherein the conductivity type dopant is p-type, the dopant gas may be diborane ($B_2H_6$) present in a ratio to silane ($SiH_4$) ranging from 0.00001% to 2%. In another embodiment, wherein the conductivity type dopant is p-type, the dopant gas may be diborane ($B_2H_6$) present in a ratio to silane ($SiH_4$) ranging from 0.0001% to 0.1%. In yet another embodiment, in which the conductivity type dopant is p-type, the dopant gas for may be trimethylboron (TMB) present in a ratio to silane ($SiH_4$) ranging from 0.1% to 10%.

In one embodiment, in which the epitaxial semiconductor material portions 32L, 32R include a p-type dopant, the p-type dopant is present within the epitaxial semiconductor material portions 32L, 32R in a concentration ranging from $1\times10^{19}$ atoms/cm$^3$ to $10^{21}$ atoms/cm$^3$. In another embodiment, in which the epitaxial semiconductor material portions 32L, 32R contain p-type dopant, the p-type dopant is present in a concentration ranging from $1\times10^{20}$ atoms/cm$^3$ to $8\times10^{20}$ atoms/cm$^3$. In one embodiment, in which the epitaxial semiconductor material portions 32L, 32R contains an n-type dopant, the n-type dopant is present in the epitaxial semiconductor material portions 32L, 32R in a concentration ranging from $1\times10^{19}$ atoms/cm$^3$ to $10^{21}$ atoms/cm$^3$. In another embodiment, in which the epitaxial semiconductor material portions 32L, 32R contain an n-type dopant, the n-type dopant is present in a concentration ranging from $1\times10^{20}$ atoms/cm$^3$ to $8\times10^{20}$ atoms/cm$^3$. The dopant within the epitaxial semiconductor material portions 32L, 32R can be uniformly present or present as a gradient.

In some embodiments of the present application, the epitaxial semiconductor material portions 32L, 32R can be hydrogenated. When hydrogenated, a hydrogen source is used in conjunction with the other source gases and the amount of hydrogen that is present within the epitaxial semiconductor material portions 32L, 32R can be from 1 atomic percent to 40 atomic percent. In another embodiment, carbon can be present in the semiconductor material 32. When present, a carbon source (such as, for example, mono-methylsilane) is used in conjunction with the other source gases and carbon, C, can be present in the epitaxial semiconductor material portions 32L, 32R in range from 0 atomic % to 4 atomic %.

In some embodiments, a non-doped semiconductor material can be epitaxial grown without the inclusion of a dopant source, and dopants can be introduced, but not necessarily always, in the non-doped semiconductor material by one of ion implantation and/or gas phase doping.

Figure 7A:
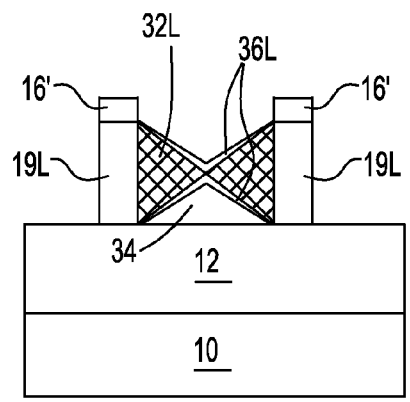
FIG. 7A is a cross sectional view illustrating the merged semiconductor fin portions of FIG. 6B after forming a second epitaxial semiconductor material on exposed surfaces of the epitaxial semiconductor material portions that merged adjacent semiconductor fins of the first set of semiconductor fins.
Figure 7B:
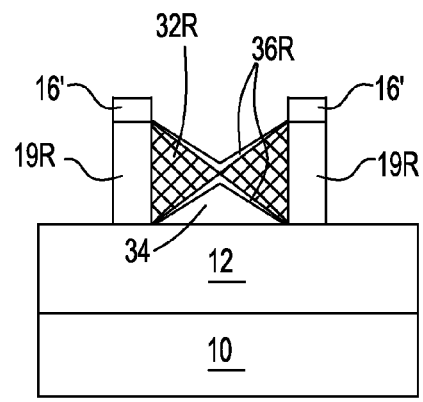
FIG. 7B is a cross sectional view illustrating the merged semiconductor fin portions of FIG. 6C after forming a second epitaxial semiconductor material on exposed surfaces of the other epitaxial semiconductor material portions that merged adjacent semiconductor fins of the second set of semiconductor fins.

Referring now to FIGS. 7A-7B, there are illustrated the first exemplary structure shown in FIGS. 6B-6C after forming a second epitaxial semiconductor material 36L, 36R on exposed surfaces of the epitaxial semiconductor material portions 32L, 32R that merged adjacent semiconductor fins of the first and second sets of semiconductor fins. The second epitaxial semiconductor material 36L, 36R follows the contour of the epitaxial semiconductor material portions 32L, 32R, does not completely fill in gap 34, and comprises a different semiconductor material than the epitaxial semiconductor material used in providing the epitaxial semiconductor material portions 32L, 32R. In one embodiment, the second epitaxial semiconductor material 36L, 36R is comprised of pure silicon. In another embodiment, the second epitaxial semiconductor material 36L, 36R is comprised of SiGe. In yet another embodiment, the second epitaxial semiconductor material 36L, 36R is comprised of pure Ge.

The second epitaxial semiconductor material 36L, 36R can be formed by any conventional epitaxial growth process. The thickness of the second epitaxial semiconductor material 36L, 36R can be from 1 nm to 10 nm. Other thickness ranges that are lesser than or greater than the aforementioned thickness range can also be used in providing the second epitaxial semiconductor material 36L, 36R.

Figure 8A:
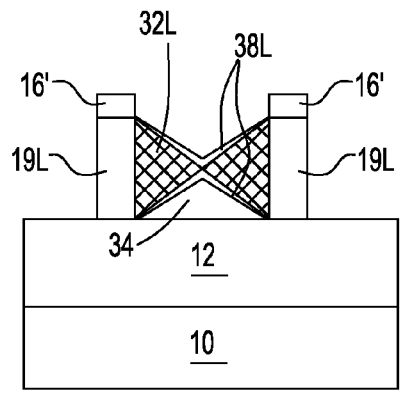
FIG. 8A is a cross sectional view illustrating the merged semiconductor fin portions of FIG. 7A after converting the second epitaxial semiconductor material into a metal semiconductor alloy on exposed surfaces of the epitaxial semiconductor material portions that merged adjacent semiconductor material portions that merged adjacent semiconductor fins of the first set of semiconductor fins.
Figure 8B:
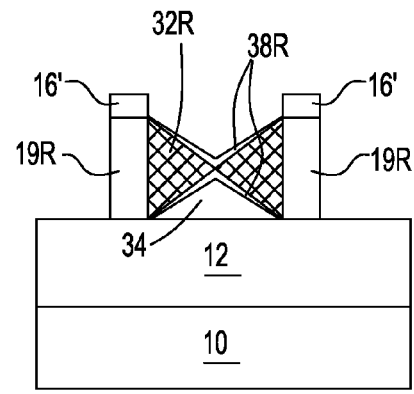
FIG. 8B is a cross sectional view illustrating the merged semiconductor fin portions of FIG. 7B after converting the second epitaxial semiconductor material into a metal semiconductor alloy on exposed surfaces of the epitaxial semiconductor material portions that merged adjacent semiconductor fins of the second set of semiconductor fins.

Referring now to FIGS. 8A-8B, there are illustrated the first exemplary semiconductor structure of FIGS. 7A-7B after converting the second epitaxial semiconductor material 36L, 36R into a metal semiconductor alloy layer 38L, 38R on exposed surfaces of the epitaxial semiconductor material portions 32L, 32R that merged adjacent semiconductor fins of the first set of semiconductor fins. As shown, the second epitaxial semiconductor material 36L, 36R is completely consumed in providing the metal semiconductor alloy layer 38L, 38R. As is also shown, gap 34 remains in the structure.

The metal semiconductor alloy layer 38L, 38R, which provides metal semiconductor alloy contacts to the epitaxial semiconductor material portions 32L, 32R can be formed by first providing a layer of a metal semiconductor alloy forming metal (not shown) to at least the exposed surfaces of the second epitaxial semiconductor material 36L, 36R. The term "metal semiconductor alloy forming metal" is used throughout the present application to denote a metal that can react with an underlying semiconductor material to form a metal semiconductor alloy. Illustrative examples of metal semiconductor alloy forming metals that can be used in the present application include at least one of nickel (Ni), platinum (Pt), palladium (Pd), titanium (Ti), tungsten (W), and cobalt (Co). The metal semiconductor alloy forming metal can be formed by a deposition process including, for example, chemical vapor deposition, plasma enhanced chemical vapor deposition, plating or sputtering. In some embodiments, a co-deposition of metal semiconductor alloy forming metals can be used. In another embodiment, a first metal semiconductor alloy forming metal can be formed, followed by a second metal semiconductor alloy forming metal. The metal semiconductor alloy metal that is formed can have a thickness from 2 to 15 nm. Other thicknesses that are greater than or lesser than the aforementioned thickness range can also be employed as the thickness of the metal semiconductor alloy forming metal.

After providing the metal semiconductor alloy forming metal and in some embodiments of the present application, a diffusion barrier (not shown) can be formed on an exposed upper surface of the metal semiconductor alloy forming metal. In another embodiment of the present application, no diffusion barrier is provided on the exposed upper surface of the metal semiconductor alloy forming metal. When present, the diffusion barrier can include a metal nitride such as, for example, TiN or TaN, and any deposition process including those mentioned above for providing the metal semiconductor alloy forming metal may be used. When present, the diffusion barrier can have a thickness from 1 nm to 20 nm.

Next, an anneal is performed under conditions that are effective in causing the metal semiconductor alloy forming metal to diffuse into, and react with, the second epitaxial semiconductor material 36L, 36R forming the metal semiconductor alloy layer 38L, 38R. In one embodiment, the metal semiconductor alloy layer 38L, 38R comprises a metal silicide such as, for example, nickel silicide or platinum-nickel silicide. In another embodiment, metal semiconductor alloy layer 38L, 38R comprises a metal germanide such as nickel germanide.

The metal semiconductor alloy formation anneal may be performed in a single step or a two-step anneal can be used. In one embodiment and when nickel is used, the metal semiconductor alloy formation anneal can be performed at a temperature of from 200° C. to 500° C. In another embodiment, temperatures greater than 500° C. can be used. The metal semiconductor alloy formation anneal is typically performed in an ambient including, for example, argon, helium, neon and/or nitrogen. The metal semiconductor alloy formation anneal can be performed utilizing a rapid thermal anneal, a spike anneal, a microwave anneal or a laser anneal. Following the metal semiconductor alloy formation anneal, the optional diffusion barrier and any unreacted metal semiconductor alloy forming metal can be removed utilizing one or more etch processes.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor device comprising:
   providing a plurality of semiconductor fins extending upward from a topmost surface of an insulator layer;
   forming a gate structure straddling a first portion of each semiconductor fin of said plurality semiconductor fins;
   forming a dielectric spacer on a sidewall of each side of said gate structure and straddling a second portion of each semiconductor fin of said plurality of semiconductor fins;
   merging an adjacent pair of semiconductor fins of said plurality of semiconductor fins, wherein said merging comprises forming an epitaxial semiconductor material portion comprising a first epitaxial semiconductor material and having a non-planar bottommost surface and a non-planar topmost surface on at least sidewalls of each exposed semiconductor fin portion;
   forming a second epitaxial semiconductor material that comprises a different semiconductor material than said first epitaxial semiconductor material on said bottommost surface and topmost surface of each epitaxial semiconductor material portion; and
   converting said second epitaxial semiconductor material into a metal semiconductor alloy.

2. The method of claim 1, wherein said forming said epitaxial semiconductor material portions comprises an epitaxial growth process that is performed at a pressure from 1 mtorr to 750 torr.

3. The method of claim 2, wherein epitaxial growth process is performed at a temperature from 200° C. to 900° C.

4. The method of claim 2, wherein each epitaxial semiconductor material portion is triangular in shape and having a base in direct physical contact with an exposed semiconductor fin portion of each semiconductor fin of said plurality of semiconductor fins, and two slanted sidewalls that converge at a tip.

5. The method of claim 2, wherein each epitaxial semiconductor material portion is diamond shaped having two slanted sidewalls that converge at a tip located over an exposed semiconductor fin portion of each semiconductor fin, and two other slanted sidewalls that converge at a tip located over the gap.

6. The method of claim 2, wherein a dopant is introduced during said epitaxial growth of said epitaxial semiconductor material portions.

7. The method of claim 2, wherein a dopant is introduced after said epitaxial growth of said epitaxial semiconductor material portions.

8. The method of claim 1, wherein each epitaxial semiconductor material portion comprises a silicon germanium alloy, and the second epitaxial semiconductor material comprises silicon.

9. The method of claim 1, wherein said converting said second epitaxial semiconductor material into a metal semiconductor alloy comprises:
   forming a metal semiconductor alloy forming metal on said second epitaxial semiconductor material; and
   annealing.

10. The method of claim 9, wherein said metal semiconductor alloy forming metal is selected from one of Ni, Pt, Pd, Ti, W, and Co.

11. The method of claim 1, wherein said forming said gate structure comprises formation of a functional gate structure comprises a gate dielectric portion and an overlying gate conductor portion.

12. The method of claim 1, wherein said forming said gate structure comprising formation of a sacrificial gate structure, and wherein said sacrificial gate structure is replaced with a functional gate structure after said merging said adjacent pair of semiconductor fins of said plurality of semiconductor fins.

13. The method of claim 1, providing said plurality of semiconductor fins comprises:
   providing a semiconductor-on-insulator substrate comprising, from bottom to top, a handle substrate, an insulator layer, and a topmost semiconductor layer; and
   patterning said topmost semiconductor layer.

14. The method of claim 13, wherein said patterning comprises a sidewall image transfer process.

15. The method of claim 1, wherein prior to said merging said adjacent pair of semiconductor fins of said plurality of semiconductor fins, source/drain regions are formed into exposed portions of each semiconductor fin.

16. The method of claim 15, wherein said source/drain regions are formed by gas phase doping, plasma doping or a gas cluster ion beam process.

* * * * *